United States Patent [19]

Lafrate et al.

[11] 3,808,680

[45] May 7, 1974

[54] CONTINUOUS PROCESSING FOR SUBSTRATE MANUFACTURE

[75] Inventors: Pasco F. Lafrate, South Burlington; Vincent L. Relyea, Jr., Essex Junction, both of Vt.

[73] Assignee: International Business Machines Corporation, Armonk, N.Y.

[22] Filed: June 30, 1972

[21] Appl. No.: 267,761

[52] U.S. Cl. .................... 29/625, 29/624, 174/68.5, 339/17 F

[51] Int. Cl. .......................... H05k 3/20, H05k 3/12

[58] Field of Search ............ 29/624, 625; 174/68.5; 317/101, 118, 119; 339/17 F, 17 M, 17 N, 18 C

[56] References Cited

UNITED STATES PATENTS

| | | | |
|---|---|---|---|
| 3,485,688 | 12/1969 | Irvine | 156/11 |
| 3,701,964 | 10/1972 | Cronin | 339/17 F |
| 3,713,072 | 1/1973 | Henschen | 339/17 F |

*Primary Examiner*—Charles W. Lanham
*Assistant Examiner*—Joseph A. Walkowski, Jr.
*Attorney, Agent, or Firm*—J. Jancin, Jr.; John Wynn

[57] ABSTRACT

A continuous process for fabricating a substrate for mounting of an integrated circuit thereon, in which an array of conductive patterns is formed in a copper sheet on a flexible insulator by a rotogravure printing and subtractive copper etch process. The flexible insulator sheet is then cut into individual pieces and a rigid member is mounted to the opposite side of the flexible insulator from the array of conducting patterns by means of contact pins which fasten the rigid members to the flexible insulator and are electrically connected to the conducting patterns.

3 Claims, 1 Drawing Figure

PATENTED MAY 7 1974 3,808,680
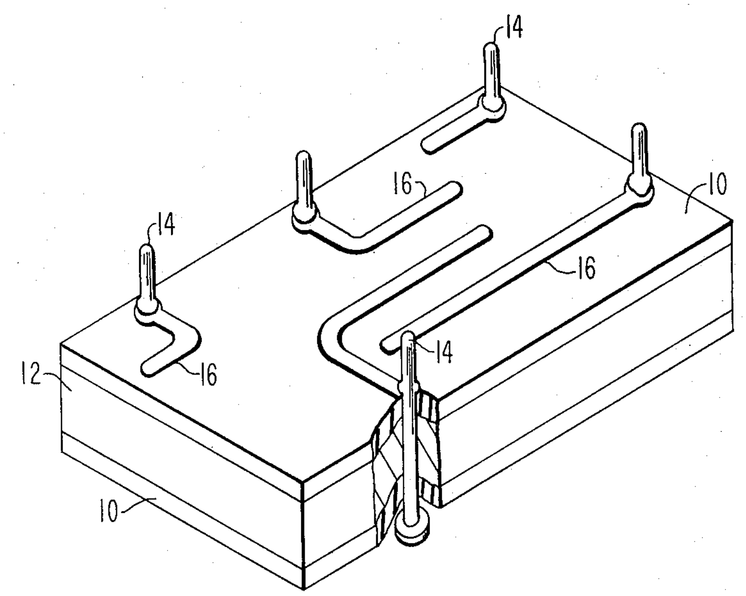

CONTINUOUS PROCESSING FOR SUBSTRATE MANUFACTURE

FIELD OF THE INVENTION

This invention relates to a continuous process for manufacturing substrates upon which integrated circuits are mounted.

BACKGROUND OF THE INVENTION

Present methods for manufacturing a rigid substrate upon which integrated circuits may be mounted consist of working with the individual rigid substrate. This process begins by printing the conductive pattern onto the individual rigid substrate by one of various techniques, for example, the metal mask process. These techniques are relatively slow and provide no real flexibility as to the thickness of the pattern. Further, in order to print a pattern on both sides of the substrate, the process must be performed serially. Once the conducting pattern has been printed onto the rigid substrate, conductive terminals or contact pins are inserted into the rigid structure so as to be approximately perpendicular to the surface upon which the conducting pattern has been printed. Mechanical forces are applied to the pins to expand the metal above and below the substrate. Each pin is suitably positioned in one of the conductive paths on the substrate and the mechanical forces result in an electrical contact between the pin and the conducting pattern. The substrate is then subjected to a solder bath so as to further assure a good electrical connection between the pin and the conductive patterns. The major disadvantage of this process is that it requires that each rigid substrate be operated upon individually, resulting in a relatively time consuming process.

A printed circuit process which offers considerable more speed is that of the rotogravure process in which hundreds of feet of flexible substrate can be printed per minute. This process consists of printing a gravure pattern of etch resistant ink upon a sheet of conducting material connected to a flexible substrate. After the printing, the excess copper is etched away and the conductive pattern remains. This technique is not suitable for rigid substrate manufacturing since the substrates must be operated upon individually, negating any speed advantage.

OBJECTS

Therefore, it is a principle object of this invention to significantly increase the speed of manufacture of rigid substrates.

SUMMARY OF THE INVENTION

In accordance with the above stated object, it has been found that rigid substrates for mounting of integrated circuits thereon may be manufactured at a considerably increased speed and with a greater degree of flexibility with regard to the conductor thickness by the following process. An array of conducting patterns is formed in a copper sheet on a flexible insulator by rotogravure printing and subtractive copper etch process; the flexible material is cut into individual pieces; a plurality of rigid members are mounted to the conducting patterns by means of a conducting material which secures the rigid member to the flexible insulator and forms an electrical connection with the conducting patterns; and the material is then subjected to a solder bath to further insure electrical connection between the conductive material and the conducting patterns. Since the rotogravure process is used, the thickness of the conductive pattern is determined by the thickness of the copper lamination upon the flexible material. Each of the steps in the process may be done at high speeds on a continuous flexible material, thus the speed of production is significantly increased permitting thousands of substrates to be produced in a matter of hours.

The foregoing and other objects, features and advantages of the invention will become apparent from the following description of the invention.

The FIGURE of the drawing shows the rigid substrate mounted to the flexible sheet by the pins.

DETAILED DESCRIPTION

According to the present invention, a continuous process is provided for fabricating a substrate upon which integrated circuits may be mounted. Unlike present techniques, in which substrates are produced on an individual basis, this process permits the substrates to be produced in a continuous manner, significantly increasing the rate of production.

The process begins with a sheet of flexible insulator usually some type of plastic. Since high temperature baths are required in the process, the plastic should usually be of the high temperature type, capable of withstanding temperatures in the range of 250°–350°C. The sheet of flexible insulator is usually a long thin strip. On at least one surface of the sheet of insulated material is laminated a conductive material. The lamination is usually done by electrodeposition or bonding. Copper is a suitable material; however, in certain applications lower expansion metals may be required. Large rolls of insulated materials such as polyimide plastic film laminated on at least one side with copper are commercially available. The thickness of the conducting material laminated upon the insulator material may be controlled, thus permitting the thickness of the patterns to be printed to be controlled. By controlling the thickness of the patterns, the resistance of the pattern, which is critical in certain applications, is also controllable.

Conductive patterns are printed on the copper, which is laminated onto the sheet of flexible insulator material, in a continuous high speed process using rotorgravure printing techniques as described in U.S. Pat. No. 3,485,688 issued on Dec. 23, 1969. This is done by depositing an etched resistant ink pattern upon the copper surface and then employing subtractive etch techniques, removing the remaining excess copper.

Holes are punched into the flexible material at predetermined locations in the printed patterns for receiving pins (these holes may also be punched before the printing process). These holes receive pins which attach a rigid individual substrate to each pattern area. The pins hold the rigid substrate to the flexible material and also forms an electrical connection with the pattern on the flexible substrate. If patterns have been printed on both sides of the flexible substrate, a small space is left between the rigid substrate and the flexible sheet; otherwise, the rigid substrate and the flexible material are held in contact by the individual pins. The rigid substrate which is usually a type of ceramic is one which can withstand some mechanical force since the pins are mechanically deformed into position. Thus, the pins function as both a mechanical support for holding the flexible sheet and the rigid substrate together and also as an electrical connection of the conductive pattern printed upon the flexible sheet. The pins may be any material which has good conductive characteristics, for example, copper. The particular process by which the pins are attached to the substrate and riveted thereto are discussed in U.S. Pat. No. 3,456,158 issued July 15, 1969.

Once the rigid substrates have been mounted to the flexible sheet, the area of the pattern is subjected to a solder bath in which the electrical connection between the pattern on the flexible material and each pin is further assured. If it is desired that the areas of the patterns other than the lands which are in contact with the pins are not to be subjected to the solder, a polyimide plastic or glass paste may be used to mask off the other areas of the pattern, usually by a screening process. However, this masking will considerably slow the process, and is not required in some cases. If tinning is required, a mask can be provided by using a polyimide film which is later etched so that specific areas may be tinned.

Thus, the continuous process has produced a rigid substrate with a conductive pattern contained thereon having pins electrically connected to the conducting patterns suitable for mounting integrated circuits thereon. It should be noted that if pins are not required, this process may be varied by using other techniques such as ultrasonics or adhesives to join the rigid substrate to the flexible sheets. Further, there may be instances in which a rigid substrate is not required at all, wherein the pins are directly connected to the flexible substrate.

The FIGURE shows a section of the flexible sheet 10 after a rigid substrate 12 has been attached to the flexible sheet 10 by contact pins 14. Contact pins 14 in addition to mechanically joining the rigid substrate 12 and the flexible sheets 10 are also electrically connected to pattern arrays 16. Although the solder bath which is referred to above is optional since the pins 14 are in physical contact with the conducting pattern arrays 16, the solder bath is further assurance that electrical contact is maintained between them.

While the invention has been particularly described with reference to the preferred embodiment thereof, it will be understood by those skilled in the art that various changes in form and detail may be made therein without departing from the spirit and scope of the invention.

We claim:

1. A high speed continuous process for fabricating a substrate for mounting of an integrated circuit thereon, consisting of the steps of:

rotogravure printing a plurality of conducting patterns arrays consisting of etched resistant ink onto a conductive sheet laminated to a continuous flexible insulator of indefinite length;

etching the conductive material which does not comprise the conducting pattern arrays;

cutting said insulator sheet into individual pieces, and;

mounting a rigid member to each of said flexible insulators in the area of said conducting pattern arrays by means of contact pins, said pins being electrically connected to said conducting pattern arrays, wherein said rigid member is provided for each of said conducting pattern arrays.

2. The process of claim 1 wherein conducting patterns are printed on both sides of said flexible insulators.

3. The process of claim 1 wherein the electrical connection between the pins and the conductive arrays is assured by the additional step of applying solder thereto.

* * * * *

UNITED STATES PATENT OFFICE
CERTIFICATE OF CORRECTION

Patent No. 3,808,680 Dated May 7, 1974

Inventor(s) P.F. Iafrate and V.L. Relyea

It is certified that error appears in the above-identified patent and that said Letters Patent are hereby corrected as shown below:

Title Page, [75] "Pasco F. Lafrate" should read --Pasco F. Iafrate--.

Signed and sealed this 8th day of October 1974.

(SEAL)
Attest:

McCOY M. GIBSON JR.
Attesting Officer

C. MARSHALL DANN
Commissioner of Patents